United States Patent
Van Damme et al.

(10) Patent No.: US 7,767,382 B2
(45) Date of Patent: Aug. 3, 2010

(54) METHOD OF MAKING A PHOTOPOLYMER PRINTING PLATE

(75) Inventors: Marc Van Damme, Bonheiden (BE); Joan Vermmersch, Deinze (BE); Alexander Williamson, Mortsel (BE); Willi-Kurt Gries, Mainz-Kastel (DE)

(73) Assignee: Agfa Graphics NV, Mortsel (BE)

( * ) Notice: Subject to any disclaimer, the term of this patent is extended or adjusted under 35 U.S.C. 154(b) by 645 days.

(21) Appl. No.: 11/132,168

(22) Filed: May 18, 2005

(65) Prior Publication Data
US 2005/0266349 A1    Dec. 1, 2005

Related U.S. Application Data

(60) Provisional application No. 60/574,667, filed on May 26, 2004.

(51) Int. Cl.
G03C 1/00 (2006.01)
G03F 7/26 (2006.01)
G03F 7/00 (2006.01)

(52) U.S. Cl. ............... 430/302; 430/300; 430/281.1; 430/270.1; 430/286.1; 101/463.1

(58) Field of Classification Search .......... 430/270.1, 430/281.1, 286.1, 300, 302; 526/335
See application file for complete search history.

(56) References Cited

U.S. PATENT DOCUMENTS

| | | |
|---|---|---|
| 3,475,171 A | 10/1969 | Alles |
| 4,245,031 A | 1/1981 | Chambers |
| 4,329,422 A | 5/1982 | Langlais |
| 4,350,756 A | 9/1982 | Burch et al. |
| 4,370,406 A | 1/1983 | Jones |
| 4,786,581 A | 11/1988 | Stahlhofen et al. |
| 4,841,040 A | 6/1989 | Just et al. |
| 4,873,174 A | 10/1989 | Dhillon et al. |
| 4,912,021 A | 3/1990 | Dhillon et al. |
| 4,959,296 A | 9/1990 | Yoshida |
| 5,049,479 A | 9/1991 | Zertani et al. |
| 5,155,011 A | 10/1992 | Zertani et al. |
| 5,532,116 A | 7/1996 | Suzuki et al. |
| 5,629,354 A | 5/1997 | West et al. |
| 5,955,238 A | 9/1999 | Yokoya |
| 5,981,144 A | 11/1999 | Damme et al. |
| 6,001,536 A | 12/1999 | Vermeersch et al. |
| 6,004,727 A | 12/1999 | Verlinden et al. |
| 6,010,824 A | 1/2000 | Komano et al. |
| 6,027,857 A | 2/2000 | Li et al. |
| 6,037,098 A | 3/2000 | Aoai et al. |
| 6,071,675 A | 6/2000 | Teng |
| 6,080,523 A | 6/2000 | Vermeersch et al. |
| 6,171,735 B1 | 1/2001 | Li et al. |
| 6,197,478 B1 | 3/2001 | Vermeersch et al. |
| 6,218,076 B1 | 4/2001 | Ogata |
| 6,232,038 B1 | 5/2001 | Takasaki et al. |
| 6,245,481 B1 | 6/2001 | Teng |
| 6,309,792 B1 | 10/2001 | Hauck et al. |
| 6,358,669 B1 | 3/2002 | Savariar-Hauck et al. |
| 6,387,595 B1 | 5/2002 | Teng |
| 6,410,205 B1 | 6/2002 | Leichsenring et al. |
| 6,420,089 B1 | 7/2002 | Baumann et al. |
| 6,482,571 B1 | 11/2002 | Teng |
| 6,534,238 B1 | 3/2003 | Savariar-Hauck et al. |
| 6,548,222 B2 | 4/2003 | Teng |
| 6,576,401 B2 | 6/2003 | Teng |
| 6,589,710 B2 | 7/2003 | Christall et al. |
| 6,605,407 B2 | 8/2003 | Yu et al. |
| 6,627,386 B2 | 9/2003 | Aoshima |
| 6,641,976 B2 | 11/2003 | Vermeersch et al. |
| 6,861,202 B2 * | 3/2005 | Toshimitsu et al. ......... 430/302 |
| 6,890,700 B2 * | 5/2005 | Tomita et al. ............ 430/271.1 |
| 6,890,702 B2 * | 5/2005 | Matsumura .............. 430/284.1 |
| 6,949,327 B2 | 9/2005 | Zheng et al. |
| 6,953,652 B2 | 10/2005 | Van Damme et al. |
| 7,198,876 B2 | 4/2007 | Inno |
| 2002/0068240 A1 | 6/2002 | Teng |
| 2002/0098447 A1 | 7/2002 | Teng |
| 2003/0036019 A1 | 2/2003 | Teng |
| 2003/0124460 A1 | 7/2003 | Munnelly et al. |

(Continued)

FOREIGN PATENT DOCUMENTS

DE    2 626 473 A1    1/1977

(Continued)

OTHER PUBLICATIONS

Agfa, "Chemistry-free digital thermal plate system: Azura," Agfa brochure (May 6, 2004).

(Continued)

Primary Examiner—Cynthia H Kelly
Assistant Examiner—Connie P Johnson
(74) Attorney, Agent, or Firm—Keating & Bennett, LLP

(57) ABSTRACT

A method of making a lithographic printing plate comprising the steps of:
a) providing a lithographic printing plate precursor comprising
  (i) a support having a hydrophilic surface or which is provided with a hydrophilic layer,
  (ii) a photopolymerizable coating on said support,
b) image-wise exposing said coating in a plate setter,
c) developing the precursor, thereby removing the non-exposed areas of the coating from the support,
whereby the developing step is carried out off-press in a gumming unit by treating the coating of the precursor with a gum solution.

62 Claims, No Drawings

U.S. PATENT DOCUMENTS

| | | | |
|---|---|---|---|
| 2003/0165777 A1 | 9/2003 | Teng | |
| 2003/0170570 A1* | 9/2003 | Vander Aa et al. | 430/302 |
| 2003/0224259 A1 | 12/2003 | Verschueren et al. | |
| 2004/0013968 A1 | 1/2004 | Teng | |
| 2004/0079246 A1* | 4/2004 | Davis et al. | 101/141 |
| 2005/0037287 A1* | 2/2005 | Verschueren et al. | 430/302 |

FOREIGN PATENT DOCUMENTS

| | | |
|---|---|---|
| EP | 222 297 A2 | 5/1987 |
| EP | 0 320 945 A2 | 6/1989 |
| EP | 0 770 497 A1 | 5/1997 |
| EP | 1 025 991 A1 | 8/2000 |
| EP | 1 025 992 A1 | 8/2000 |
| EP | 1 075 941 A2 | 2/2001 |
| EP | 1 079 276 A1 | 2/2001 |
| EP | 1110747 A1 | 6/2001 |
| EP | 1 241 002 A2 | 9/2002 |
| EP | 1 288 720 A1 | 3/2003 |
| EP | 1 341 040 A1 | 9/2003 |
| EP | 1 342 568 A1 | 9/2003 |
| EP | 1342568 A1 * | 9/2003 |
| EP | 1 349 006 A1 | 10/2003 |
| EP | 1356929 A2 | 10/2003 |
| EP | 1 359 008 A1 | 11/2003 |
| EP | 1 366 898 A2 | 12/2003 |
| EP | 1 369 231 A2 | 12/2003 |
| EP | 1 369 232 A2 | 12/2003 |
| EP | 1378794 A1 * | 1/2004 |
| EP | 1 513 020 A2 | 3/2005 |
| GB | 1 148 362 | 4/1969 |
| JP | 09-171250 | 6/1997 |
| WO | WO 02/04210 A1 | 1/2002 |
| WO | WO 02/101469 A1 | 12/2002 |
| WO | 2005111717 A2 | 11/2005 |
| WO | 2006037716 A1 | 4/2006 |
| WO | 2004095141 A1 | 11/2006 |

OTHER PUBLICATIONS

European Search Report; Ep 04 07 6475 (Dec. 1, 2004).

F.R. Mayers; "Management of Change in the Aluminum Printing Industry;" Vol. 42; p. 69 (2002).

International Search Report issued in corresponding International Patent Application No. PCT/EP2005/052298, dated Oct. 6, 2005.

Office Action issued Jun. 7, 2004. U.S. Appl. No. 10/379,362. "Method of developing a heat-sensitive lithographic printing plate precursor with a gum solution."

Office Action issued Nov. 18, 2004. U.S. Appl. No. 10/379,362. "Method of developing a heat-sensitive lithographic printing plate precursor with a gum solution."

Office Action issued Aug. 12, 2005. U.S. Appl. No. 10/379,362. "Method of developing a heat-sensitive lithographic printing plate precursor with a gum solution."

Office Action issued Dec. 6, 2005. U.S. Appl. No. 10/379,362. "Method of developing a heat-sensitive lithographic printing plate precursor with a gum solution."

Office Action issued Jul. 28, 2006. U.S. Appl. No. 10/379,362. "Method of developing a heat-sensitive lithographic printing plate precursor with a gum solution."

U.S. Appl. No. 10/379,362, filed Mar. 4, 2003. "Method of developing a heat-sensitive lithographic printing plate precursor with a gum solution."

* cited by examiner

METHOD OF MAKING A PHOTOPOLYMER PRINTING PLATE

FIELD OF THE INVENTION

The present invention relates to a method for making a lithographic printing plate whereby an negative-working photopolymer printing plate precursor is image-wise exposed and developed off-press in a gumming unit with a gum solution thereby developing and gumming the plate in a single step.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Photopolymers can be sensitized for blue, green or red light (i.e. wavelength range between 450 and 750 nm), for violet light (i.e. wavelength range between 350 and 450 nm) or for infrared light (i.e. wavelength range between 750 and 1500 nm). Laser sources have been increasingly used to expose a printing plate precursor which is sensitized to a corresponding laser wavelength. Typically, an Ar laser (488 nm) or a FD-YAG laser (532 nm) can be used for exposing a visible light sensitized photopolymer plate. The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material. An infrared laser diode emitting around 830 nm or a Nd-YAG laser emitting around 1060 nm can also be used.

Typically, a photopolymer plate is processed in alkaline developer having a pH>10. Currently, most commercial lithographic plates require an additional gumming process after the exposed plates is developed and before it is put on the press, and needs to be protected for contamination, e.g. by oxidation, fingerprints, fats, oil or dust, or for damaging, e.g. by scratches during handling of the plate. Such an additional gumming step is not convenient for the end-user, because it is a time consuming step and requires an additional gumming station.

WO 02/101 469 discloses a method of processing an imageable element useful as alkaline-developable lithographic printing plate precursor wherein the element is developed and gummed with an aqueous alkaline developing-gumming solution comprising a water-soluble polyhydroxy compound having a specific structure.

EP 1 342 568 discloses a method for making a heat-sensitive lithographic printing plate wherein the image-wise heated precursor, comprising a coating of hydrophobic thermoplastic polymer particles which coalescence on heating, is developed with a gum solution. A practical embodiment for this type of printing plates was introduced by Agfa under the name of Azura technology.

In U.S. Pat. Nos. 6,027,857, 6,171,735, 6,420,089, 6,071,675, 6,245,481, 6,387,595, 6,482,571, 6,576,401 and 6,548,222 a method is disclosed for preparing a lithographic printing plate wherein a photopolymer plate, after image-wise exposure, is mounted on a press and processed on-press by applying ink and fountain to remove the unexposed areas from the support. Also US 2003/16577 and US 2004/13968 disclose a method wherein a plate comprising a photopolymerizable layer can be processed in an on-press processing with fountain and ink or with a non-alkaline aqueous developer.

A first problem associated with on-press processing of such photopolymer printing plates is the lack of daylight stability, i.e. the image is not stable before processing and, therefore, the exposed plate needs to be processed within a short time after the exposure. However, since on-press processing is not possible during a print job, the end-user must wait until the previous print job has been completed before the exposed plate can be mounted on the press and processed. As a result, the exposure of the plate for the next print job must be delayed until just before the completion of the previous print job, so as to avoid that the unprocessed plate is affected by the ambient light. Alternatively, the exposed plate must be kept under safe-light conditions, but this again reduces the ease of use and convenience that are normally associated with e.g. violet- and infrared-sensitive photopolymer plates.

A second problem left unsolved in the prior art about on-press processable photopolymer plates is the lack of a visible image between exposure and processing. Although it is known to add a colorant to the photosensitive coating, so as to obtain a visible image after removal of the non-exposed areas of the coating by the processing, this does not allow to distinguish an exposed plate from an unexposed plate immediately after the image-wise exposure, let alone to inspect the image quality after the exposure, because the visible image is only revealed after the on-press processing. Moreover, on-press processable plates normally do not contain a colorant because the on-press removal of the non-printing areas of the coating may cause contamination of the fountain solution and/or the ink and it may take an unacceptable number of printed copies before the contamination by said colorant has disappeared.

A third problem associated with on-press processing with fountain and ink is an insufficient clean-out of the non-exposed areas.

SUMMARY OF THE INVENTION

It is an object of the present invention to provide a method for making a lithographic printing plate by means of a photopolymer plate precursor, which is perceived by the user as a method which does not require a processing step and wherein the exposed plate can be kept in ambient light during an unlimited time before being mounted on the press. This object is realized by the method defined in claim 1, having the specific feature that the exposed plate is off-press processed by means of a gum solution. Since the non-exposed areas of the photopolymer plate are removed by the gumming step, the lithographic image can no longer be affected by ambient daylight. On the contrary, further exposure to daylight would only increase the polymerization degree of the exposed areas, i.e. would strengthen rather than deteriorate the image. In addition, the present inventiors have unexpectedly observed that gum-processing produces a better clean-out than on-press processing by means of fountain solution and ink.

It is a further object of the present invention to provide a method for making a lithographic printing plate by means of a photopolymer plate precursor, which is perceived by the user as a method which does not require a processing step and wherein the exposed plate can be kept in ambient light during an unlimited time before being mounted on the press, and wherein a visible image is provided before mounting the plate on the press. This object is realized by adding a colorant to the coating of the photopolymer plate. Since the non-printing areas of the coating are removed in the gumming step, there is no risk of contamination of the fountain solution or ink during the start of the print job.

Other specific embodiments of the invention are defined in the dependent claims.

DETAILED DESCRIPTION OF THE INVENTION

In accordance with the present invention, there is provided a method of making a lithographic printing plate comprising the steps of:

a) providing a lithographic printing plate precursor comprising
   (i) a support having a hydrophilic surface or which is provided with a hydrophilic layer,
   (ii) a coating on said support, comprising a photopolymerisable layer,
b) image-wise exposing said coating in a plate setter,
c) developing the precursor, thereby removing the non-exposed areas of the coating from the support, characterised in that the developing step is carried out off-press in the gumming unit by treating the coating of the precursor with a gum solution.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such compounds are film-forming hydrophilic polymers or surfactants. The layer that remains on the plate after treatment with the gum solution preferably comprises between 0.05 and 20 g/m$^2$ of the surface protective compound.

A gum solution is normally supplied as a concentrated solution which is diluted by the end user with water before use according to the instructions of the supplier. In the present description, all concentrations of compounds present in the gum solution are expressed as percentage by weight (wt. % or % w/w) relative to the non-diluted gum solution, unless otherwise indicated.

Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 40 to 50 mN/m.

The gum solution comprises preferably an anionic surfactant, more preferably an anionic surfactant whereof the anionic group is a sulphonic acid group.

Examples of the anionic surfactant include aliphates, abietates, hydroxyalkanesulfonates, alkanesulfonates, dialkylsulfosuccinates, straight-chain alkylbenzenesulfonates, branched alkylbenzenesulfonates, alkynaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyox-yethylenealkylethers, salts of phosphoric esters of polyoxyethylenealkylphenylethers, partially saponified compounds of styrenemaleic anhydride copolymers, partially saponified compounds of olefin-maleic anhydride copolymers, and naphthalene-sulfonateformalin condensates. Particularly preferred among these anionic surfactants are dialkylsulfosuccinates, salts of alkylsulfuric esters and alkylnaphthalenesulfonates.

Specific examples of suitable anionic surfactants include sodium dodecylphenoxybenzene disulfonate, the sodium salt of alkylated naphthalenesulfonate, disodium methylene-dinaphthalene-disulfonate, sodium dodecyl-benzenesulfonate, sulfonated alkyl-diphenyloxide, ammonium or potassium perfluoroalkylsulfonate and sodium dioctyl-sulfosuccinate.

Suitable examples of the nonionic surfactants include polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliphatic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, and trialkylamine oxides. Particularly preferred among these nonionic surfactants are polyoxyethylene alkylphenyl ethers and poloxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 20 wt. %.

According to the present invention the gum solution has a pH-value preferably between 3 and 9, more preferably between 4.5 and 8.5, most preferably between 5 and 7. The pH of the gum solution is usually adjusted with a mineral acid, an organic acid or an inorganic salt in an amount of from 0.01 to 2 wt. %. Examples of the mineral acids include nitric acid, sulfuric acid, phosphoric acid and metaphosphoric acid. Especially organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acid include citric acid, acetic acid, oxalic acid, malonic acid, p-toluenesulfonic acid, tartaric acid, malic acid, lactic acid, levulinic acid, phytic acid and organic phosphonic acid.

The gum solution further comprises preferably an inorganic salt. Examples of the inorganic salt include magnesium nitrate, monobasic sodium phosphate, dibasic sodium phosphate, nickel sulfate, sodium hexametaphosphate and sodium tripolyphosphate. An alkali-metal dihydrogen phosphate such as $KH_2PO_4$ or $NaH_2PO_4$ is most preferred. Other inorganic salts can be used as corrosion inhibiting agents, e.g. magnesium sulfate or zinc nitrate. The mineral acid, organic acid or inorganic salt may be used singly or in combination with one or more thereof.

In accordance with another embodiment of the present invention, the gum solution as developer in the processing of the plate comprises preferably a mixture of an anionic surfactant and an inorganic salt. In this mixture the anionic surfactant is preferably an anionic surfactant with a sulphonic acid group, more preferably an alkali-metal salt of a mono- or di-alkyl substituted diphenylether-sulphonic acid, and the inorganic salt is preferably a mono or dibasic phosphate salt, more preferably an alkali-metal dihydrogen phosphate, most preferably $KH_2PO_4$ or $NaH_2PO_4$.

In accordance with another embodiment of the present invention, the gum solution comprising a mixture of an anionic surfactant and an inorganic salt has preferably a pH-value between 3 and 9, more preferably between 4 and 8, most preferably between 5 and 7.

Besides the foregoing components, a wetting agent such as ethylene glycol, propylene glycol, triethylene glycol, butylene glycol, hexylene glycol, diethylene glycol, dipropylene glycol, glycerin, trimethylol propane and diglycerin may also be present in the gum solution. The wetting agent may be used singly or in combination with one or more thereof. In general, the foregoing wetting agent is preferably used in an amount of from 1 to 25 wt. %.

Further, a chelate compound may be present in the gum solution. Calcium ion and other impurities contained in the diluting water can have adverse effects on printing and thus cause the contamination of printed matter. This problem can be eliminated by adding a chelate compound to the diluting water. Preferred examples of such a chelate compound include organic phosphonic acids or phosphonoalkanetricarboxylic acids. Specific examples are potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri (methylenephosphonic acid). Besides these sodium or potassium salts of these chelating agents, organic amine salts are useful. The preferred amount of such a chelating agent to be added is from 0.001 to 1.0 wt. % relative to the gum solution in diluted form.

Further, an antiseptic and an anti-foaming agent may be present in the gum solution. Examples of such an antiseptic include phenol, derivatives thereof, formalin, imidazole derivatives, sodium dehydroacetate, 4-isothiazoline-3-one derivatives, benzoisothiazoline-3-one, benztriazole derivatives, amidineguanidine derivatives, quaternary ammonium salts, pyridine derivatives, quinoline derivatives, guanidine derivatives, diazine, triazole derivatives, oxazole and oxazine derivatives. The preferred amount of such an antiseptic to be added is such that it can exert a stable effect on bacteria, fungi, yeast or the like. Though depending on the kind of bacteria, fungi and yeast, it is preferably from 0.01 to 4 wt. % relative to the gum solution in diluted form. Further, preferably, two or more antiseptics may be used in combination to exert an aseptic effect on various fungi and bacteria. The anti-foaming agent is preferably silicone anti-foaming agents. Among these anti-foaming agents, either an emulsion dispersion type or solubilized type anti-foaming agent may be used. The proper amount of such an anti-foaming agent to be added is from 0.001 to 1.0 wt. % relative to the gum solution in diluted form.

Besides the foregoing components, an ink receptivity agent may be present in the gum solution if desired. Examples of such an ink receptivity agent include turpentine oil, xylene, toluene, low heptane, solvent naphtha, kerosine, mineral spirit, hydrocarbons such as petroleum fraction having a boiling point of about 120° C. to about 250° C., diester phthalates (e.g., dibutyl phthalate, diheptyl phthalate, di-n-octyl phthalate, di (2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di (2-ethylhexyl) sebacate dioctyl sebacate), epoxidated triglycerides (e.g., epoxy soyabean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate). Examples of other solvents which can be used in combination with these solvents include ketones (e.g., cyclohexanone), halogenated hydrocarbons (e.g., ethylene dichloride), ethylene glycol ethers (e.g., ethylene glycol monomethyl ether, ethylene glycol monophenyl ether, ethylene glycol monobutyl ether), aliphatic acids (e.g., caproic acid, enathic acid, caprylic acid, pelargonic acid, capric acid, undecylic acid, lauric acid, tridecylic acid, myristic acid, pentadecylic acid, palmitic acid, heptadecylic acid, stearic acid, nonadecanic acid, arachic acid, behenic acid, lignoceric acid, cerotic acid, heptacosanoic acid, montanic acid, melissic acid, lacceric acid, isovaleric acid) and unsaturated aliphatic acids (e.g., acrylic acid, crotonic acid, isocrotonic acid, undecyclic acid, oleic acid, elaidic acid, cetoleic acid, erucic acid, butecidic acid, sorbic acid, linoleic acid, linolenic acid, arachidonic acid, propiolic acid, stearolic acid, clupanodonic acid, tariric acid, licanic acid). Preferably, it is an aliphatic acid which is liquid at a temperature of 50° C., more preferably has from 5 to 25 carbon atoms, most preferably has from 8 to 21 carbon atoms. The ink receptivity agent may be used singly or in combination with one or more thereof. The ink receptivity agent is preferably used in an amount of from 0.01 to 10 wt. %, more preferably from 0.05 to 5 wt. %. The foregoing ink receptivity agent may be present as an oil-in-water emulsion or may be solubilized with the aid of a solubilizing agent.

The viscosity of the gum solution can be adjusted to a value of e.g. between 1.7 and 5 mPa·s, by adding viscosity increasing compounds, such as poly(ethylene oxide), e.g. having a molecular weight between $10^5$ and $10^7$. Such compounds can be present in a concentration of 0.01 to 10 g/l.

A baking gum has a similar composition as described above, with the additional preference towards compounds that do not evaporate at the usual bake temperatures. Specific examples of suitable baking gum solutions are described in e.g. EP-A 222 297, EP-A 1 025 992, DE-A 2 626 473 and U.S. Pat. No. 4,786,581.

A particularly preferred lithographic support is an electrochemically grained and anodized aluminum support. Graining an anodizing of aluminum supports is well known. The acid used for graining can be e.g. nitric acid or sulfuric acid. The acid used for graining preferably comprises hydrogen chloride. Also mixtures of e.g. hydrogen chloride and acetic acid can be used. The relation between electrochemical graining and anodizing parameters such as electrode voltage, nature and concentration of the acid electrolyte or power consumption on the one hand and the obtained lithographic quality in terms of Ra and anodic weight (g/m² of $Al_2O_3$ formed on the aluminum surface) on the other hand is well known. More details about the relation between various production parameters and Ra or anodic weight can be found in e.g. the article "Management of Change in the Aluminium Printing Industry" by F. R. Mayers, published in the ATB Metallurgie Journal, volume 42 nr. 1-2 (2002) pag. 69.

The anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid, commercially available from ALLIED COLLOIDS.

The grained and anodized aluminum support may be a sheet-like material such as a plate or it may be a cylindrical element such as a sleeve which can be slid around a print cylinder of a printing press.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

The lithographic printing plate precursor used in the method of the present invention is negative-working and develops a lithographic image consisting of hydrophobic and hydrophilic areas at the exposed and non-exposed areas respectively. The hydrophilic areas are defined by the support which has a hydrophilic surface or is provided with a hydrophilic layer. The hydrophobic areas are defined by the coating, hardened upon exposing, optionally followed by a heating step.

Here, "hardened" means that the coating becomes insoluble or non-dispersible for the gum solution and may be achieved through polymerization and/or crosslinking of the photosensitive coating, optionally followed by a heating step to enhance or to speed-up the polymerization and/or crosslinking reaction. In this optionally heating step, hereinafter also referred to as "pre-heat", the plate precursor is heated, preferably at a temperature of about 80° C. to 150° C. and preferably during a dwell time of about 5 seconds to 1 minute.

The coating on the support comprises a photopolymerizable layer. This layer comprises a polymerizable monomer or oligomer and an initiator capable of hardening said monomer or oligomer and, optionally, a sensitizer capable of absorbing light used in the image-wise exposing step.

The coating thickness of the photopolymerizable layer is preferably between 0.1 and 4.0 g/m², more preferably between 0.4 and 2.0 g/m².

According to one embodiment of the present invention, said polymerizable monomer or oligomer is a monomer or oligomer comprising at least one epoxy or vinyl ether functional group and said initiator is a Bronsted acid generator capable of generating free acid, optionally in the presence of a sensitizer, upon exposure, hereinafter said initiator also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol Aepichlorohydrin epoxy resin and multifunctional epichlorohydrinitetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

According to a more preferred embodiment of the present invention, said polymerizable monomer or oligomer is a ethylenically unsaturated compound, having at least one terminal ethylenic group, hereinafter also referred to as "free-radical polymerizable monomer", and said initiator is a compound, capable of generating free radical, optionally in the presence of a sensitizer, upon exposure, hereinafter said initiator also referred to as "free radical initiator".

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic mono-mers may also have other double bond or epoxide group, in addition to (meth) acrylate group. The (meth)acrylate monomers may also contain an acidic (such as carboxylic acid) or basic (such as amine) functionality.

Any free radical initiator capable of generating free radical in the presence of a sensitizer upon exposure can be used as a free radical initiator of this invention. Suitable free-radical initiators include, for example, the derivatives of acetophenone (such as 2,2-dimethoxy-2-phenylacetophenone, and 2-methyl-1-[4-(methylthio) phenyl1-2-morpholino propan-1-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, and triphenylsulfonium triphenyl(n-butyl)borate, and borate salts as described in U.S. Pat. Nos. 6,232,038 and 6,218,076,); haloalkyl substituted s-triazines (such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis(trichloromethyl)-6-[(4-ethoxy-ethylenoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopentadien-1-yl) bis[2,6-difluoro-3-(1H-pyrrol-1-yl]phenyl) titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines.

According to another embodiment of the present invention, said polymerizable monomer or oligomer may be a combination of a monomer or oligomer comprising at least one epoxy or vinyl ether functional group and a polymerizable ethylenically unsaturated compound, having at least one terminal ethylenic group, and said initiator may be a combination of a cationic initiator and a free-radical initiator. A monomer or oligomer comprising at least one epoxy or vinyl ether functional group and a polymerizable ethylenically unsaturated compound, having at least one terminal ethylenic group, can be the same compound wherein the compound contains both ethylenic group and epoxy or vinyl ether group. Examples of such compounds include epoxy functional acrylic monomers, such as glycidyl acrylate. The free radical initiator and the cationic initiator can be the same compound if the compound is capable of generating both free radical and free acid. Examples of such compounds include various onium salts such as diaryliodonium hexafluoroantimonate and s-triazines such as 2,4-bis(trichloromethyl)-6-[(4-ethoxyethylenoxy)-phen-1-yl]-s-triazine which are capable of generating both free radical and free acid in the presence of a sensitizer.

The photopolymerizable layer may also comprise a multifunctional monomer. This monomer contains at least two functional groups selected from an ethylenically unsaturated group and/or an epoxy or vinyl ether group. Particular multifunctional monomers for use in the photopolymer coating are disclosed in U.S. Pat. Nos. 6,410,205, 5,049,479, EP 1079276, EP 1369232, EP 1369231 EP 1341040, U.S. 2003/0124460, EP 1241002, EP 1288720 and in the reference book including the cited refences: Chemistry & Technology UV & EB formulation for coatings, inks & paints-Volume 2-Prepolymers and Reactive Diluents for UV and EB Curable Formulations by N. S. Allen, M. A. Johnson, P. K. T. Oldring, M. S. Salim-Edited by P. K. T. Oldring-1991-ISBN 0 947798102.

The photopolymerizable layer may also comprise a co-initiator. Typically, a co-initiator is used in combination with a free radical initiator and/or cationic initator. Particular co-initiators for use in the photopolymer coating are disclosed in U.S. Pat. Nos. 6,410,205, 5,049,479, EP 1079276, 1369232, EP 1369231 EP 1341040, U.S. 2003/0124460, EP 1241002, EP 1288720 and in the reference book including the cited refences: Chemistry & Technology UV & EB formulation for coatings, inks & paints-Volume 3-Photoinitiators for Free Radical and Cationic Polymerisation by K. K. Dietliker-Edited by P. K. T. Oldring-1991-ISBN 0 947798161.

The photopolymerizable layer may also comprise an inhibitor. Particular inhibitors for use in the photopolymer coating are disclosed in U.S. Pat. No. 6,410,205 and EP 1288720.

The photopolymerizable layer may also comprise a binder. The binder can be selected from a wide series of organic polymers. Compositions of different binders can also be used. Useful binders include for example chlorinated polyalkylene (in particular chlorinated polyethylene and chlorinated polypropylene), polymethacrylic acid alkyl esters or alkenyl esters (in particular polymethyl (meth)acrylate, polyethyl (meth)acrylate, polybutyl (meth)acrylate, polyisobutyl (meth)acrylate, polyhexyl (meth)acrylate, poly(2-ethylhexyl) (meth)acrylate and polyalkyl (meth)acrylate copolymers of (meth) acrylic acid alkyl esters or alkenyl esters with other copolymerizable monomers (in particular with (met) acrylonitrile, vinyl chloride, vinylidene chloride, styrene and/or butadiene), polyvinyl chloride (PVC, vinylchloride/(meth) acrylonitrile copolymers, polyvinylidene chloride (PVDC), vinylidene chloride/(meth)acrylonitrile copolymers, polyvinyl acetate, polyvinyl alcohol, polyvinyl pyrrolidone, copolymers of vinyl pyrrolidone or alkylated vinyl pyrrolidone, polyvinyl caprolactam, copolymers of vinyl caprolactam, poly (meth)acrylonitrile, (meth)acrylonitrile/styrene copolymers, (meth)acrylamide/alkyl (meth)acrylate copolymers, (meth)acrylonitrile/butadiene/styrene (ABS) terpolymers, polystyrene, poly($\alpha$-methylstyrene), polyamides, polyurthanes, polyesters, methyl cellulose, ethylcellulose, acetyl cellulose, hydroxy-($C_1$-$C_4$-alkyl) cellulose, carboxymethyl cellulose, polyvinyl formal and polyvinyl butyral. Particulary preferred binders are polymers having vinylcaprolactam, vinylpyrrolidone or alkylated vinylpyrrolidone as monomeric units. Alkylated vinylpyrrolidone polymers can be obtained by grafting alfa-olefines onto the vinylpyrrolidone polymer backbone. Typical examples of such products are the Agrimer AL Graft polymers commercially available from ISP. The length of the alkylation group may vary from $C_4$ to $C_{30}$. Other useful binders are binders containing carboxyl groups, in particular copolymers containing monomeric units of α,β-unsaturated carboxylic acids or monomeric units of α,β-unsaturated dicarboxylic acids (preferably acrylic acid, methacrylic acid, crotonic acid, vinylacetic acid, maleic acid or itaconic acid). By the term "copolymers" are to be understood in the context of the present invention as polymers containing units of at least 2 different monomers, thus also terpolymers and higher mixed polymers. Particular examples of useful copolymers are those containing units of (meth) acrylic acid and units of alkyl (meth)acrylates, allyl (meth) acrylates and/or (meth)acrylonitrile as well as copolymers containing units of crotonic acid and units of alkyl (meth) acrylates and/or (meth)acrylonitrile and vinylacetic acid/ alkyl (meth)acrylate copolymers. Also suitable are copolymers containing units of maleic anhydride or maleic acid monoalkyl esters. Among these are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl (meth)acrylates, allyl alcohol, hydroxystyrene or vinyl alcohol, as well as epoxy resins, provided they carry a sufficient number of free OH groups. Particular useful binder and particular useful reactive binders are disclosed in EP 1 369 232, EP 1 369 231, EP 1 341 040, U.S. 2003/0124460, EP 1 241 002, EP 1 288 720, U.S. Pat. Nos. 6,027, 857, 6,171,735 and 6,420,089.

Also particular suitable binders are copolymers of vinylacetate and vinylalcohol, preferably comprising vinylalcohol in an amount of 10 to 98 mol % vinylalcohol, more preferably between 35 and 95 mol %, most preferably 40 and 75 mol %, best results are obtained with 50 to 65 mol % vinylalcohol. The ester-value, measured by the method as defined in DIN 53 401, of the copolymers of vinylacetate and vinylalcohol ranges preferably between 25 and 700 mg KOH/g, more preferably between 50 and 500 mg KOH/g, most preferably between 100 and 300 mg KOH/g. The viscosity of the copolymers of vinylacetate and vinylalcohol are measured on a 4 weight % aqueous solution at 20° C. as defined in DIN 53 015 and the viscosity ranges preferably between 3 and 60 mPa·s, more preferably between 4 and 30 mPa·s, most preferably between 5 and 25 mPa·s. The average molecular weight $M_W$ of the copolymers of vinylacetate and vinylalcohol ranges preferably between 5 000 and 500 000 g/mol, more preferably between 10 000 and 400 000 g/mol, most preferably between 15 000 and 250 000 g/mol.

The organic polymers used as binders have a typical mean molecular weight $M_W$ between 600 and 200 000, preferably between 1 000 and 100 000. Preference is further given to polymers having an acid number between 10 to 250, preferably 20 to 200, or a hydroxyl number between 50 and 750, preferably between 100 and 500. The amount of binder(s) generally ranges from 10 to 90% by weight, preferably 20 to 80% by weight, relative to the total weight of the non-volatile components of the composition.

Various surfactants may be added into the photopolymerizable layer to allow or enhance the developability of the precursor with a gum solution. Both polymeric and small molecule surfactants can be used. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added in an amount ranging between 0.1 and 30% by weight of the coating, more preferably between 0.5 and 20%, and most preferably between 1 and 15%.

The photopolymerizable layer may also comprise a sensitizer. Preferred sensitizers are violet light absorbing sensitizers, having an absorption spectrum between 350 nm and 450 nm, preferably between 370 nm and 420 nm, more preferably between 390 nm and 415 nm. Particular preferred sensitizers are disclosed in EP 1 349 006 and EP-A-3103499, filed on 22/09/2003, and including the cited references in these two patent applications. Other preferred sensitizers are infrared light absorbing sensitizers, having an absorption spectrum between 750 nm and 1300 nm, preferably between 780 nm and 1200 nm, more preferably between 800 nm and 1100 nm. Particular preferred sensitizers are disclosed in EP 1 359 008, including the cited references. Other preferred sensitizers are blue, green or red light absorbing sensitizers, having an absorption spectrum between 450 nm and 750 nm. Useful sensitizers can be selected from the sensitising dyes disclosed in U.S. Pat. Nos. 6,410,205, 5,049,479, EP 1 079 276, EP 1 369 232, EP 1 369 231, EP 1 341 040, US 2003/0124460, EP 1 241 002, EP 1 288 720 and in the reference book including the cited refences: Chemistry & Technology UV & EB formulation for coatings, inks & paints-Volume 3-Photoinitiators for Free Radical and Cationic Polymerisation by K. K. Dietliker-Edited by P. K. T. Oldring-1991-ISBN 0 947798161.

In accordance with another preferred embodiment of the present invention, the coating of the precursor further comprises a colorant. The colorant can be present in the photopolymerizable layer or in a separate layer below or above the photopolymerizable layer. After processing with a gum solution, at least part of the colorant remains on the hardened coating areas and produces a visible image on the support.

The colorant can be a dye or a pigment. A dye or pigment can be used as a colorant when the layer, comprising the dye or pigment, is colored for the human eye.

In one embodiment of the present invention, the colorant is a pigment. Various types of pigments can be used such as organic pigments, inorganic pigments, carbon black, metallic powder pigments and fluorescent pigments. Organic pigments are preferred.

Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

Specific examples of pigments usable as colorant are the following (herein is C.I. an abbreviation for Color Index; under a Blue colored pigment is understood a pigment that appears blue for the human eye; the other colored pigments have to be understood in an analogue way):

Blue colored pigments which include C.I. Pigment Blue 1, C.I. Pigment Blue 2, C.I. Pigment Blue 3, C.I. Pigment Blue 15:3, C.I. Pigment Blue 15:4, C.I. Pigment Blue 15:34, C.I. Pigment Blue 16, C.I. Pigment Blue 22, C.I. Pigment Blue 60 and the like; and C.I. Vat Blue 4, C.I. Vat Blue 60 and the like;

Red colored pigments which include C.I. Pigment Red 5, C.I. Pigment Red 7, C.I. Pigment Red 12, C.I. Pigment Red 48 (Ca), C.I. Pigment Red 48 (Mn), C.I. Pigment Red 57 (Ca), C.I. Pigment Red 57 1, C.I. Pigment Red 112, C.I. Pigment Red 122, C.I. Pigment Red 123, C.I. Pigment Red 168, C.I. Pigment Red 184, C.I. Pigment Red 202, and C.I. Pigment Red 209;

Yellow colored pigments which include C.I. Pigment Yellow 1, C.I. Pigment Yellow 2, C.I. Pigment Yellow 3, C.I. Pigment Yellow 12, C.I. Pigment Yellow 13, C.I. Pigment Yellow 14C, C.I. Pigment Yellow 16, C.I. Pigment Yellow 17, C.I. Pigment Yellow 73, C.I. Pigment Yellow 74, C.I. Pigment Yellow 75, C.I. Pigment Yellow 83, C.I. Pigment Yellow 93, C.I. Pigment Yellow 95, C.I. Pigment Yellow 97, C.I. Pigment Yellow 98, C.I. Pigment Yellow 109, C.I. Pigment Yellow 110, C.I. Pigment Yellow 114, C.I. Pigment Yellow 128, C.I. Pigment Yellow 129, C.I. Pigment Yellow 138, C.I. Pigment Yellow 150, C.I. Pigment Yellow 151, C.I. Pigment Yellow 154, C.I. Pigment Yellow 155, C.I. Pigment Yellow 180, and C.I. Pigment Yellow 185;

Orange colored pigments include C.I. Pigment Orange 36, C.I. Pigment Orange 43, and a mixture of these pigments. Green colored pigments include C.I. Pigment Green 7, C.I. Pigment Green 36, and a mixture of these pigments;

Black colored pigments include: those manufactured by Mitsubishi Chemical Corporation, for example, No. 2300, No. 900, MCF 88, No. 33, No. 40, No. 45, No. 52, MA 7, MA 8, MA 100, and No. 2200 B; those manufactured by Columbian Carbon Co., Ltd., for example, Raven 5750, Raven 5250, Raven 5000, Raven 3500, Raven 1255, and Raven 700; those manufactured by Cabot Corporation, for example, Regal 400 R, Regal 330 R, Regal 660 R, Mogul L, Monarch 700, Monarch 800, Monarch 880, Monarch 900, Monarch 1000, Monarch 1100, Monarch 1300, and Monarch 1400; and those manufactured by Degussa, for example, Color Black FW 1, Color Black FW 2, Color Black FW 2 V, Color Black FW 18, Color Black FW 200, Color Black S 150, Color Black S 160, Color Black S 170, Printex 35, Printex U, Printex V, Printex 140 U, Special Black 6, Special Black 5, Special Black 4A, and Special Black 4.

Other types of pigments such as brown pigments, violet pigments, fluorescent pigments and metallic powder pigments can also be used as colorant. The pigments may be used alone or as a mixture of two or more pigments as colorant.

Blue colored pigments, including cyan pigments, are preferred.

The pigments may be used with or without being subjected to surface treatment of the pigment particles. Preferavbly, the pigments are subjected to surface treatment. Methods for surface treatment include methods of applying a surface coat of resin, methods of applying surfactant, and methods of bonding a reactive material (for example, a silane coupling agent, an epoxy compound, polyisocyanate, or the like) to the surface of the pigment. Suitable examples of pigments with surface treatment are the modified pigments described in WO 02/04210. Specifically the blue colored modified pigments described in WO 02/04210 are preferred as colorant in the present invention.

The pigments have a particle size which is preferably less than 10 μm, more preferably less than 5 μm and especially preferably less than 3 μm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill and a press kneader. Details thereof are described in "Latest Pigment Applied Technology" (CMC Publications, published in 1986).

A dispersing agent may be omitted in the preparation of dispersions of so-called self-dispersing pigments. Specific examples of self-dispersing pigments are pigments with are subjected to a surface treatment in such a way the pigment surface is compatible with the dispersing liquid. Typical examples of self-dispersing pigments in an aqueous medium are pigments which have ionic or ionisable groups or polyethyleneoxide chains coupled to the particle-surface. Examples of ionic or ionisable groups are acid groups or salts thereof such as carboxylic acid group, sulphonic acid, phosphoric acid or phosphonic acid and alkali metal salts of these acids. Suitable examples of self-dispersing pigments are described in WO 02/04210 and these are preferred in the present invention. The blue colored self-dispersing pigments in WO 02/04210 are preferred.

Typically, the amount of pigment in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

In another embodiment of the present invention, a dye can be used as colorant in the photopolymerizable coating. Any known dyes, such as commercially available dyes or dyes described in, for example, "Dye Handbook" (edited by the Organic Synthetic Chemistry Association, published in 1970) which are colored for the human eye, can be used as colorant in the photopolymerizable coating. Specific examples thereof include azo dyes, metal complex salt azo dyes, pyrazolone azo dyes, anthraquinone dyes, phthalacyanine dyes, carbionium dyes, quinonimine dyes, methine dyes, and the like. Phthalocyanine dyes are preferrred. Suitable dyes are salt-forming organic dyes and may be selected from oil-soluble dyes and basic dyes. Specific examples thereof are (herein is CI an abbreviation for Color Index): Oil Yellow 101, Oil Yellow 103, Oil Pink 312, Oil Green BG, Oil Bue GOS, Oil Blue 603, Oil Black BY, Oil Black BS, Oil Black T-505, Victoria Pure Blue, Crystal Violet (CI42555), Methyl Violet (CI42535), Ethyl Violet, Rhodamine B (CI415170B), Malachite Green (CI42000), Methylene Blue (CI52015). Also, the dyes disclosed in GB 2 192 729 may be used as colorant.

Typically, the amount of dye in the coating may be in the range of about 0.005 $g/m^2$ to 2 $g/m^2$, preferably about 0.007 $g/m^2$ to 0.5 $g/m^2$, more preferably about 0.01 $g/m^2$ to 0.2 $g/m^2$, most preferably about 0.01 $g/m^2$ to 0.1 $g/m^2$.

The contrast of the image formed after processing depends on the amount and the extinction coefficient of the colorant remaining in the exposed areas of the plate. The contrast of the image formed after processing is defined as the difference between the optical density in the exposed area to the optical density in the non-exposed area. The optical density values, reported hereinafter, are measured in reflectance by an optical densitometer, which is equipped with several filters (e.g. cyan, magenta, yellow). The optical densities are measured with a filter in correspondence with the color of the colorant, e.g. a cyan filter is used for measuring the optical density of a blue colored image layer.

In order to obtain a sufficient contrast for the present invention, the value of this difference in optical density is preferably at least 0.3, more preferably at least 0.4, and most preferably at least 0.5. There is no specific upper limit for the contrast value, but typically the contrast is not higher than 3.0 or even not higher than 2.0.

In order to obtain a good visual contrast for a human observer the type of color of the colorant may also be important. Preferred colors for the colorant are cyan or blue colors, i.e. under blue color we understand a color that appears blue for the human eye.

According to a preferred embodiment of the present invention, the photopolymerizable coating comprises a top layer which acts as an oxygen barrier layer. Preferred binders which can be used in the top layer are polyvinyl alcohol and the polymers disclosed in EP-A-3103498, filed on Sep. 22, 2003, U.S. Pat. No. 6,410,205 and EP 1 288 720, including the cited references in these patents and patent applications. The coating thickness of the top layer is preferably between 0.10 and 2.0 g/m$^2$, more preferably between 0.20 and 1.5 g/m$^2$, most preferably between 0.25 and 1.0 g/m$^2$. In another embodiment, the top layer may comprise a film-forming hydrophilic polymer or surfactant, optionally the other compounds of the gum solution as mentioned above.

The image-wise exposing step can be carried out by a laser, e.g. laser diodes emitting around 830 nm, NdYAG lasers emitting around 1060 nm, violet lasers emitting around 400 nm or a gas laser such as Ar laser, by digital modulated UV-exposure, e.g. by means of digital mirror devices, or by a conventional exposure in contact with a mask. The laser exposure and digital modulated UV-exposure are preferred.

According to another embodiment of the present invention, the developing step is carried out off-press with a gum solution in a gumming unit which is provided with at least one roller for rubbing and/or brushing the coating during the development. By using this gumming unit the non-exposed coating areas may removed from the support more completely and at a higher speed.

According to another preferred embodiment of the present invention, the exposing step is carried out in a plate setter which is mechanically coupled to the gumming unit by conveying means wherein the precursor is shielded from ambient light.

EXAMPLES

Examples 1 and 2

In the examples 1 and 2 the invention is demonstrated for a violet sensitive photopolymerisable composition.

Example 1

Preparation of the Printing Plate Precursor

Components Used in Example 1:

(A) A solution containing 32.4 wt. % of a methyl methacrylate/methacrylic acid-copolymer (ratio methylmethacrylate/methacrylic acid of 4:1 by weight; acid number: 110 mg KOH/g) in 2-butanone (viscosity 105 mm$^2$/s at 25° C.).
(B) A solution containing 88.2 wt. % of a reaction product from 1 mole of 2,2,4-trimethyl-hexamethylenediisocyanate and 2 moles of hydroxyethylmethacrylate (viscosity 3.30 mm$^2$/s at 25° C.).
(C) Mono Z1620, a solution in 2-butanone containing 30.1 wt. % of a reaction product from 1 mole of hexamethylenediisocyanate, 1 mole of 2-hydroxyethylmethacrylate and 0.5 mole of 2-(2-hydroxyethyl)-piperidine (viscosity 1.7 mm$^2$/s at 25° C.).
(D) 1,4-distyryl-(3,5-trimethoxy, 4-(2-butyl)oxy)benzene.
(E) Heliogene blue D 7490® dispersion (9.9 wt. %, viscosity 7.0 mm$^2$/s at 25° C.), trade name of BASF AG, as defined in EP 1 072 956.
(F) 2,2'-Bis(2-chlorophenyl)-4,4',5,5'-tetraphenyl-1,2-bisimidazole.
(G) 2-Mercaptobenzothiazole.
(H) Edaplan LA 411® (1 wt. % in Dowanol PM®, trade mark of Dow Chemical Company).
(I) 2-Butanone.
(J) Propyleneglycol-monomethylether (Dowanol PM®, trade mark of Dow Chemical Company).
(K) Partially hydrolyzed poly(vinyl alcohol) (degree of saponification 88 mol-%, viscosity 4 mPa·s in an aqueous solution of 4 wt. % at 20° C.).
(L) Fully hydrolyzed poly(vinyl alcohol) (degree of saponification 98 mol-%, viscosity 6 mPa·s in an aqueous solution of 4 wt. % at 20° C.).
(M) Partially hydrolyzed poly(vinyl alcohol) (degree of saponification 88 mol %, viscosity 8 mPa·s in an aqueous solution of 4 wt. % at 20° C.).
(N) Acticide LA1206; a biocide commercially available from Thor.
(O) Metolat FC 355 (ethoxylated ethylenediamine; commercially available from Münzing Chemie):

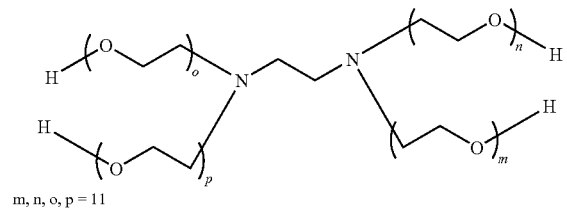

m, n, o, p = 11

(P) Lutensol A8 (90 wt. %) (surface active agent commercially available from BASF)
(O) Water A) Preparation and Coating of the Photopolymerizable Composition A composition was prepared (pw=parts per weight; wt. %=weight percentage) by mixing the ingredients as specified in Table 1. This composition was coated on an electrochemically roughened and anodically oxidized aluminum sheet, the surface of which has been rendered hydrophilic by treatment with an aqueous solution of poly(vinyl phosphonic) acid (oxide weight 3 g/m$^2$) and was dried at 105° C. The resulting thickness of the layer was 1.5 g/m$^2$.

TABLE 1

Composition of the photopolymerizable coating solution

| Component | Parts per weight (g) |
|---|---|
| (A) | 181.70 |
| (B) | 36.14 |
| (C) | 381.23 |
| (D) | 10.97 |

TABLE 1-continued

Composition of the photopolymerizable coating solution

| Component | Parts per weight (g) |
|---|---|
| (E) | 207.11 |
| (F) | 16.58 |
| (G) | 0.77 |
| (H) | 25.50 |
| (I) | 650.07 |
| (J) | 1489.95 |

B) Preparation and Coating of the Top Layer

On top of the photopolymerizable layer a solution in water (containing 2.0 wt. %) of the composition as defined in Table 2 was coated and then was dried at 120° C. for 2 minutes

TABLE 2 coating composition of the top layer

| Component | Parts per weight (g) |
|---|---|
| (K) | 550.67 |
| (L) | 475.82 |
| (M) | 237.91 |
| (N) | 2.56 |
| (O) | 12.11 |
| (P) | 1.03 |
| (Q) | 62719.90 |

The top layer had a dry thickness of 0.95 g/m$^2$.

Preparation of the Printing Plate

The plate was imaged with an energy density of 40 µJ/cm$^2$. The imaging was carried out with an experimental violet platesetter device (flat bed system) equipped with a violet laser diode emitting between 392 to 417 nm. The following imaging conditions were used:

Scanning speed: 1000 m/s

Variable image plane power: 0 to 10.5 mW

Spot diameter: 20 µm

Addressability: 1270 dpi

After imaging the plate was pre-heated for 1 min. at 100° C. After the pre-heat step the plate was cleaned with THERMO-TECT (baking/gum solution commercially available from TECHNOVA). The gumming solution has a pH of 8.36. The non-image areas were removed by the gumming step. The obtained image had a cyan density of 1.06 (measured with a GretagMacbeth D19C densitometer). The plate was tested on a Heidelberg GTO46 press and good prints were obtained.

Example 2

The imaging element as prepared in Example 1 was exposed at 500 µJ/cm$^2$ using the same experimental platesetter as defined in Example 1, but without a pre-heat step. Next the plate was cleaned with the THERMOTECT gum solution (baking/gum solution commercially available from TECHNOVA). The non-image areas were removed by this cleaning step. The obtained image had a cyan density of 1.06 (measured with a GretagMacbeth D19C densitometer). The plate was tested on a Heidelberg GTO46 press and good prints were obtained.

Example 3

In this example the invention is demonstrated for a IR sensitive photopolymerisable composition.

Preparation of the Printing Plate Precursor

Components Used in the Example (A) A solution containing 32.8 wt. % of a methyl methacrylate/methacrylic acid-copolymer (ratio methylmethacrylate/methacrylic acid of 4:1 by weight; acid number: 110 mg KOH/g) in 2-butanone (viscosity 105 mm$^2$/s at 25° C.).

(B) A solution containing 86.8 wt. % of a reaction product from 1 mole of 2,2,4-trimethyl-hexamethylenediisocyanate and 2 moles of hydroxyethylmethacrylate (viscosity 3.30 mm$^2$/s at 25° C.).

(C) S0094 (IR-dye commercially available from FEW Chemicals)

(D) Heliogene blue D 7490® dispersion (9.9 wt. %, viscosity 7.0 mm$^2$/s at 25° C.), trade name of BASF AG, as defined in EP 1 072 956.

(E) 2,4-Bis-trichlormethyl-6-diphenyl-4-yl-[1,3,5]triazin.

(F) Edaplan LA 411® (1 wt. % in Dowanol PM®, trade mark of Dow Chemical Company).

(G) 2-Butanone.

(H) Propyleneglycol-monomethylether (Dowanol PM®, trade mark of Dow Chemical Company).

(I) Fully hydrolyzed poly(vinyl alcohol) (degree of saponification 98 mol-%, viscosity 6 mPa·s in an aqueous solution of 4 wt. % at 20° C.)

(J) Partially hydrolyzed poly(vinyl alcohol) (degree of saponification 88 mol %, viscosity 8 mPa·s in an aqueous solution of 4 wt. % at 20° C.).

(K) Polyvinylpyrrolidon (k–value=30)

(L) Water

A) Preparation and Coating of the Photopolymerizable Composition

A composition was prepared (pw=parts per weight; wt. %=weight percentage) by mixing the ingredients as specified in Table 3. This composition was coated on an electrochemically roughened and anodically oxidized aluminum sheet, the surface of which has been rendered hydrophilic by treatment with an aqueous solution of poly(vinyl phosphonic) acid (oxide weight 3 g/m$^2$) and was dried at 105° C. The resulting thickness of the layer was 1.5 g/m$^2$.

TABLE 3

Composition of the photopolymerizable coating solution

| Component | Parts per weight (g) |
|---|---|
| (A) | 6.92 |
| (B) | 3.77 |
| (C) | 0.16 |
| (D) | 6.87 |
| (E) | 0.41 |
| (F) | 0.68 |
| (G) | 20.50 |
| (H) | 40.70 |

B) Preparation and Coating of the Top Layer

On top of the photopolymerizable coating a solution in water (containing 4.0 wt. %) of the composition as defined in Table 4 was coated and then was dried at 120° C. for 2 minutes

TABLE 4 coating composition of the top layer

| Component | Parts per weight (g) |
|---|---|
| (I) | 10.00 |
| (J) | 10.00 |
| (K) | 5.00 |
| (L) | 600.00 |

The top layer had a dry thickness of 1.50 g/m$^2$.

Preparation of the Printing Plate

The plate was imaged with an energy density of 80 mJ/cm$^2$. The imaging was carried out with a Creo Trendsetter 3244T. Next the plate was pre-heated for 1 min. at 100° C.

After the pre-heat step the plate was cleaned with THERMO-TECT (baking/gum solution commercially available from TECHNOVA). The non-image areas were removed by the gumming step. The obtained image had a cyan density of 1.17 (measured with a GretagMacbeth D19C densitometer). The plate was tested on a Heidelberg GTO46 press and good prints were obtained.

Examples 4 to 7

Preparation of the Printing Plate Precursors

Components Used in Examples (B) A solution containing 88.2 wt. % of a reaction product from 1 mole of 2,2,4-trimethyl-hexamethylenediisocyanate and 2 moles of hydroxyethylmethacrylate (viscosity 3.30 mm$^2$/s at 25° C.).

(C) Mono Z1620, a solution in 2-butanone containing 30.1 wt. % of a reaction product from 1 mole of hexamethylenediisocyanate, 1 mole of 2-hydroxyethylmethacrylate and 0.5 mole of 2-(2-hydroxyethyl)-piperidine (viscosity 1.7 mm$^2$/s at 25° C.).

(D) 1,4-distyryl-(3,5-trimethoxy, 4-(2-butyl)oxy)benzene.

(E) Heliogene blue D 7490® dispersion (9.9 wt. %, viscosity 7.0 mm$^2$/s at 25° C.), trade name of BASF AG, as defined in EP 1 072 956.

(F) Hostanox 03, Phenolic antioxydant form Clariant (G) 2,2'-Bis(2-chlorophenyl)-4,4',5,5'-tetraphenyl-1,2-bisimidazole.

(H) 2-Mercaptobenzothiazole.

(I) Edaplan LA 411® (10 wt. % in Dowanol PM®, trade mark of Dow Chemical Company).

(J) 2-Butanone.

(K) Propyleneglycol-monomethylether (Dowanol PM®, trade mark of Dow Chemical Company).

(L) Partially hydrolyzed poly(vinyl alcohol) (degree of saponification 88 mol-%, viscosity 4 mPa·s in an aqueous solution of 4 wt. % at 20° C.).

(M) Fully hydrolyzed poly(vinyl alcohol) (degree of saponification 98 mol-%, viscosity 6 mPa·s in an aqueous solution of 4 wt. % at 20° C.)

(N) Partially hydrolyzed poly(vinyl alcohol) (degree of saponification 88 mol %, viscosity 8 mPa·s in an aqueous solution of 4 wt. % at 20° C.).

(O) Acticide LA1206; a biocide commercially available from Thor.

(P) Lupasol P (polyethylene imine 50% in Water, commercially available from BASF)

(Q) Lutensol A8 (90 wt. %) (surface active agent commercially available from BASF)

(R) Water

A) Preparation and Coating of the Photopolymerizable Composition

A composition was prepared (pw=parts per weight; wt. %=weight percentage) by mixing the ingredients as specified in Table 5. This composition was coated on an electrochemically roughened and anodically oxidized aluminum sheet, the surface of which has been rendered hydrophilic by treatment with an aqueous solution of poly(vinyl phosphonic) acid (oxide weight 3 g/m$^2$) and was dried at 105° C. The resulting thickness of the layer was 1.5 g/m$^2$.

TABLE 5

Composition of the photopolymerizable coating solution

| Component | Example 4 | Example 5 | Example 6 | Example 7 |
|---|---|---|---|---|
| PVP/VA I-335 (1) | 138.34 | | | |
| PVP/VA S-630 (2) | | 345.84 | | |
| Luvitec K 90 (3) | | | 345.84 | |
| PVCB (4) | | | | 345.84 |
| (B) | 36.22 | 36.22 | 36.22 | 36.22 |
| (C) | 382.50 | 382.50 | 382.50 | 382.50 |
| (D) | 10.97 | 10.97 | 10.97 | 10.97 |
| (E) | 209.88 | 209.88 | 209.88 | 209.88 |
| (F) | 1.28 | 1.28 | 1.28 | 1.28 |
| (G) | 16.58 | 16.58 | 16.58 | 16.58 |
| (H) | 0.77 | 0.77 | 0.77 | 0.77 |
| (I) | 2.55 | 2.55 | 2.55 | 2.55 |
| (J) | 682.07 | 682.07 | 682.07 | 682.07 |
| (K) | 1508.98 | 1508.98 | 1508.98 | 1508.98 |

(1) PVP/VA I-335 (50% isopropylalcohol) is a co(vinylpyrolidon-vinylacetate) copolymer, available from ISP
(2) PVP/VA S-630 (20% Dowanol) is a co(vinylpyrolidon-vinylacetate) copolymer, available from ISP
(3) Luvitec K 90 (20% in Dowanol) is a polyvinylpyrolidon, available from BASF
(4) PVCB (20% in Dowanol) is the reaction product of POVAL 405 with phtalic anhydride, available from CLARIANT (Poval 405 is a copolymer of vinylacetate and vinyl alcohol available from KURARAY)

B) Preparation and Coating of the Top Layer

On top of these photopolymerizable layers, a solution in water (containing 2.0 wt. %) of the composition as defined in Table 6 was coated and then was dried at 120° C. for 2 minutes. The top layer had a dry thickness of 1.75 g/m$^2$.

TABLE 6 coating composition of the top layer

| Component | Parts per weight (g) |
|---|---|
| (L) | 511.08 |
| (M) | 446.08 |
| (N) | 223.04 |
| (O) | 2.40 |
| (P) | 12.00 |
| (Q) | 11.40 |
| (R) | 28794.00 |

The plates were imaged with an energy density of 57 μJ/cm$^2$. The imaging was carried out with an experimental violet platesetter device (flat bed system) equipped with a violet laser diode emitting between 392 to 417 nm. The following imaging conditions were used:

Scanning speed: 1000 m/s
Spot diameter: 20 µm
Addressability: 1270 dpi

Each plate was divided in several parts and some of these parts are treated with and without a pre-heating step, performed for 20 sec. at 116° C., and processed at room temperature in different solutions as indicated in Table 7 (Gum-1, Gum-2 or Water). Table 7 summarizes the clean-out results of the non-exposed areas after processing with the different solutions. Rating 0 indicates no image formation, rating 1 indicates poor image formation with an insufficient clean-out, rating 2 indicates good image differentiation and a good clean-out, rating 3 indicates good image differentiation with excellent clean-out. Rating 3 and rating 2 correspond to a sufficient clean-out (invention examples), rating 0 and rating 1 correspond to a insufficient clean-out (comparative examples).

Gum-1 is a solution prepared as follow:
  To 750 g demineralised water
  100 ml of Dowfax 3B2 (commercially available from Dow Chemical)
  31.25 g 1,3-benzene disulphonic acid disodium salt (available from Riedel de Haan)
  31.25 ml Versa TL77 (a polystyrene sulphonic acid available from Alco Chemical)
  10.4 g trisodium citrate dihydrate,
  2 ml of Acticide LA1206 (a biocide from Thor),
  2.08 g of Polyox WSRN-750 (available from Union Carbide) were added under stirring and demineralised water was further added to 1000 g.
  pH is between 7.2 and 7.8

Gum-2 is a solution prepared as follow:
  To 700 g demineralised water
  77.3 ml of Dowfax 3B2 (commercially available from Dow Chemical)
  32.6 g of trisodium citrate dihydrate,
  9.8 g citric acid were added under stirring and demineralised water was further added to 1000 g.

Next, to 5000 g of this solution, 95 g trisodium phosphate was added. This solution was brought to pH=7 with a solution of 10 weight % of trisodium phosphate.

TABLE 7

| EXAMPLE | Clean-out tests | | | |
|---|---|---|---|---|
| | Pre-heat (20 s 116° C.) | Processing solution | Rating (0 to 3) | Comment |
| Example 4 | Yes | Gum-1 | 3 | Invention Example |
| | No | Gum-1 | 2 | Invention Example |
| | YES | Gum-2 | 3 | Invention Example |
| | NO | Gum-2 | 2 | Invention Example |
| | YES | Water | 1 | Comparative Example |
| | NO | Water | 1 | Comparative Example |
| Example 5 | Yes | Gum-1 | 3 | Invention Example |
| | No | Gum-1 | 2 | Invention Example |
| | YES | Gum-2 | 3 | Invention Example |
| | NO | Gum-2 | 2 | Invention Example |
| | YES | Water | 1 | Comparative Example |
| | NO | Water | 1 | Comparative Example |
| Example 6 | Yes | Gum-1 | 2 | Invention Example |
| | No | Gum-1 | 2 | Invention Example |
| | YES | Gum-2 | 2 | Invention Example |
| | NO | Gum-2 | 2 | Invention Example |

TABLE 7-continued

| EXAMPLE | Clean-out tests | | | |
|---|---|---|---|---|
| | Pre-heat (20 s 116° C.) | Processing solution | Rating (0 to 3) | Comment |
| | YES | Water | 1 | Comparative Example |
| | NO | Water | 1 | Comparative Example |
| Example 7 | YES | Gum-2 | 2 | Invention Example |
| | NO | Gum-2 | 2 | Invention Example |
| | YES | Water | 0 | Comparative Example |
| | NO | Water | 0 | Comparative Example |

The examples in Table 7 demonstrate the improved clean-out obtained for the plates processed with a gum-solution of the present invention, compared with a processing with water wherein the clean-out is insufficiently.

Examples 8 to 11

Preparation of the Printing Plate Precursors

Components Used in Example (B) A solution containing 88.2 wt. % of a reaction product from 1 mole of 2,2,4-trimethyl-hexamethylenediisocyanate and 2 moles of hydroxyethylmethacrylate (viscosity 3.30 mm$^2$/s at 25° C.).

(C) Mono Z1620, a solution in 2-butanone containing 30.1 wt. % of a reaction product from 1 mole of hexamethylenediisocyanate, 1 mole of 2-hydroxyethylmethacrylate and 0.5 mole of 2-(2-hydroxyethyl)-piperidine (viscosity 1.7 mm$^2$/s at 25° C.).

(D) 1,4-distyryl-(3,5-trimethoxy, 4-(2-butyl)oxy)benzene.

(E) Heliogene blue D 7490® dispersion (9.9 wt. %, viscosity 7.0 mm$^2$/s at 25° C.), trade name of BASF AG, as defined in EP 1 072 956.

(F) Hostanox 03, Phenolic antioxydant form Clariant (G) 2,2'-Bis(2-chlorophenyl)-4,4',5,5'-tetraphenyl-1,2-bisimidazole.

(H) 2-Mercaptobenzothiazole.

(I) Edaplan LA 411® (10 wt. % in Dowanol PM®, trade mark of Dow Chemical Company).

(J) 2-Butanone.

(K) Propyleneglycol-monomethylether (Dowanol PM®, trade mark of Dow Chemical Company).

(L) Partially hydrolyzed poly(vinyl alcohol) (degree of saponification 88 mol-%, viscosity 4 mPa·s in an aqueous solution of 4 wt. % at 20° C.).

(M) Fully hydrolyzed poly(vinyl alcohol) (degree of saponification 98 mol-%, viscosity 6 mPa·s in an aqueous solution of 4 wt. % at 20° C.)

(N) Partially hydrolyzed poly(vinyl alcohol) (degree of saponification 88 mol %, viscosity 8 mPa·s in an aqueous solution of 4 wt. % at 20° C.).

(O) Acticide LA1206; a biocide commercially available from Thor.

(P) Lupasol P (polyethylene imine 50% in Water, commercially available from BASF)
(Q) Lutensol A8 (90 wt. %) (surface active agent commercially available from BASF)
(R) Water A) Preparation and Coating of the Photopolymerizable Composition A composition was prepared (pw=parts per weight; wt. %=weight percentage) by mixing the ingredients as specified in Table 8. This composition was coated on an electrochemically roughened and anodically oxidized aluminum sheet, the surface of which has been rendered hydrophilic by treatment with an aqueous solution of poly(vinyl phosphonic) acid (oxide weight 3 g/m$^2$) and was dried at 105° C. The resulting thickness of the layer was 1.5 g/m$^2$.

TABLE 8

Composition of the photopolymerizable coating solution

| Component | Example 9 | Example 10 | Example 11 |
|---|---|---|---|
| Gantrez ES425 (1) | 114.01 | | |
| Gantrez ES435 (2) | | 114.01 | |
| Gantrez A425 (3) | | | 114.01 |
| (B) | 36.22 | 36.22 | 36.22 |
| (C) | 382.50 | 382.50 | 382.50 |
| (D) | 10.97 | 10.97 | 10.97 |
| (E) | 209.88 | 209.88 | 209.88 |
| (F) | 1.28 | 1.28 | 1.28 |
| (G) | 16.58 | 16.58 | 16.58 |
| (H) | 0.77 | 0.77 | 0.77 |
| (I) | 2.55 | 2.55 | 2.55 |
| (J) | 771.00 | 771.00 | 771.00 |
| (K) | 1454.25 | 1454.25 | 1454.25 |

(1) Gantrez ES425 is a (half) butylester of co(vinylmethylether - maleic anhydride), available form ISP
(2) Gantrez ES435 is a (half) butylester of co(vinylmethylether - maleic anhydride), available form ISP
(3) Gantrez A425 is a (half) butylester of co(vinylmethylether - maleic anhydride), available form ISP B) Preparation and Coating of the Top Layer On top of these photopolymerizable layers, a solution in water (containing 2.0 wt. %) of the composition as defined in Table 9 was coated and then was dried at 120° C. for 2 minutes. The top layer had a dry thickness of 1.75 g/m$^2$.

TABLE 9 coating composition of the top layer

| Component | Parts per weight (g) |
|---|---|
| (L) | 511.08 |
| (M) | 446.08 |
| (N) | 223.04 |
| (O) | 2.40 |
| (P) | 12.00 |
| (Q) | 11.40 |
| (R) | 28794.00 |

The plates were imaged with an energy density of 57 µJ/cm$^2$. The imaging was carried out with an experimental violet platesetter device (flat bed system) equipped with a violet laser diode emitting between 392 to 417 nm. The following imaging conditions were used:
Scanning speed: 1000 m/s
Spot diameter: 20 µm
Addressability: 1270 dpi Each plate was divided in several parts and some of these parts are treated with and without a pre-heating step, performed for 20 sec. at 116° C., and processed at room temperature in different solutions as indicated in Table 10 (Gum-1 and Gum-2 for the invention examples, Water as comparative example). Table 10 summarizes the clean-out results of the non-exposed areas after processing with the different solutions. Rating 0 indicates no image formation, rating 1 indicates poor image formation with an insufficient clean-out, rating 2 indicates good image differentiation and a good clean-out, rating 3 indicates good image differentiation with excellent clean-out. Rating 3 and rating 2 correspond to a sufficient clean-out (invention examples), rating 0 and rating 1 correspond to a insufficient clean-out (comparative examples).

TABLE 10

Clean-out tests

| EXAMPLE | Pre-heat (20 s 116° C.) | Processing solution | Rating (0 to 3) | Comment |
|---|---|---|---|---|
| Example 9 | Yes | Gum-2 | 2 | Invention Example |
| | No | Gum-2 | 2 | Invention Example |
| | YES | Water | 0 | Comparative Example |
| | NO | Water | 0 | Comparative Example |
| Example 10 | Yes | Gum-2 | 2 | Invention Example |
| | No | Gum-2 | 2 | Invention Example |
| | YES | Water | 0 | Comparative Example |
| | NO | Water | 0 | Comparative Example |
| Example 11 | Yes | Gum-2 | 2 | Invention Example |
| | No | Gum-2 | 2 | Invention Example |
| | YES | Water | 0 | Comparative Example |
| | NO | Water | 0 | Comparative Example |

The examples in Table 10 demonstrate the improved clean-out obtained for the plates processed with a gum-solution of the present invention, compared with a processing with water wherein the clean-out is insufficiently.

Examples 12 to 17

Preparation of the Printing Plate Precursors

Components Used in Examples (B) A solution containing 88.2 wt. % of a reaction product from 1 mole of 2,2,4-trimethyl-hexamethylenediisocyanate and 2 moles of hydroxyethylmethacrylate (viscosity 3.30 mm$^2$/s at 25° C.).

(C) Mono Z1620, a solution in 2-butanone containing 30.1 wt. % of a reaction product from 1 mole of hexamethylenediisocyanate, 1 mole of 2-hydroxyethylmethacrylate and 0.5 mole of 2-(2-hydroxyethyl)-piperidine (viscosity 1.7 mm$^2$/s at 25° C.).

(D) 1,4-distyryl-(3,5-trimethoxy, 4-(2-butyl)oxy)benzene.

(G) Heliogene blue D 7490® dispersion (9.9 wt. %, viscosity 7.0 mm$^2$/s at 25° C.), trade name of BASF AG, as defined in EP 1 072 956.

(H) Hostanox 03, Phenolic antioxydant form Clariant (G) 2,2'-Bis(2-chlorophenyl)-4,4',5,5'-tetraphenyl-1,2-bisimidazole.

(H) 2-Mercaptobenzothiazole.
(I) Edaplan LA 411® (10 wt. % in Dowanol PM®, trade mark of Dow Chemical Company).
(J) 2-Butanone.
(K) Propyleneglycol-monomethylether (Dowanol PM®, trade mark of Dow Chemical Company).
(L) Partially hydrolyzed poly(vinyl alcohol) (degree of saponification 88 mol-%, viscosity 4 mPa·s in an aqueous solution of 4 wt. % at 20° C.).
(M) Fully hydrolyzed poly(vinyl alcohol) (degree of saponification 98 mol-%, viscosity 6 mPa·s in an aqueous solution of 4 wt. % at 20° C.)
(N) Partially hydrolyzed poly(vinyl alcohol) (degree of saponification 88 mol %, viscosity 8 mPa·s in an aqueous solution of 4 wt. % at 20° C.).
(O) Acticide LA1206; a biocide commercially available from Thor.
(Q) Lupasol P (polyethylene imine 50% in Water, commercially available from BASF)
(Q) Lutensol A8 (90 wt. %) (surface active agent commercially available from BASF)
(R) Water A) Preparation and Coating of the Photopolymerizable Composition A composition was prepared (pw=parts per weight; wt. %=weight percentage) by mixing the ingredients as specified in Table 11. This composition was coated on an electrochemically roughened and anodically oxidized aluminum sheet, the surface of which has been rendered hydrophilic by treatment with an aqueous solution of poly(vinyl phosphonic) acid (oxide weight 3 g/m$^2$) and was dried at 105° C. The resulting thickness of the layer was 1.5 g/m$^2$.

TABLE 11

Composition of the photopolymerizable coating solution

| Component | Example 12 | Example 13 | Example 14 | Example 15 | Example 16 | Example 17 |
|---|---|---|---|---|---|---|
| (1) | 148.22 | | | | | |
| (2) | | 345.84 | | | | |
| (3) | | | 138.34 | | | |
| (4) | | | | 138.34 | | |
| (5) | | | | | 138.34 | |
| (6) | | | | | | 345.84 |
| (B) | 36.22 | 36.22 | 36.22 | 36.22 | 36.22 | 36.22 |
| (C) | 382.50 | 382.50 | 382.50 | 382.50 | 382.50 | 382.50 |
| (D) | 10.97 | 10.97 | 10.97 | 10.97 | 10.97 | 10.97 |
| (E) | 209.88 | 209.88 | 209.88 | 209.88 | 209.88 | 209.88 |
| (F) | 1.28 | 1.28 | 1.28 | 1.28 | 1.28 | 1.28 |
| (G) | 16.58 | 16.58 | 16.58 | 16.58 | 16.58 | 16.58 |
| (H) | 0.77 | 0.77 | 0.77 | 0.77 | 0.77 | 0.77 |
| (I) | 2.55 | 2.55 | 2.55 | 2.55 | 2.55 | 2.55 |
| (J) | 682.07 | 682.07 | 682.07 | 682.07 | 682.07 | 682.07 |
| (K) | 1508.98 | 1508.98 | 1508.98 | 1508.98 | 1508.98 | 1508.98 |

(1) Luvitec Vcap K43E (40% in ethanol) is a polyvinylcaprolactam, available from BASF
(2) Agrimer AL-10 LC (20% Dowanol) is a butylated poly(vinylpyrrolidone), available from ISP
(3) Antaron V 516 (50% in isopropanol) is a polyvinylpyrrolidone grafted with hexadecene, available from MAPRIC
(4) PVP/VA I-535 (50% isopropanol) is a copolymer of vinylpyrrolidone and vinylacetate, available from ISP
(5) PVP/VA I-735 (50% isopropanol) is a copolymer of vinylpyrrolidone and vinylacetate, available from ISP
(6) Luvitec K 30 (20% Dowanol) is a polyvinylpyrrolidone, available from BASF B) Preparation and Coating of the Top Layer On top of these photopolymerizable layers, a solution in water (containing 2.0 wt. %) of the composition as defined in Table 12 was coated and then was dried at 120° C. for 2 minutes. The top layer had a dry thickness of 1.75 g/m$^2$.

TABLE 12 coating composition of the top layer

| Component | Parts per weight (g) |
|---|---|
| (L) | 511.08 |
| (M) | 446.08 |
| (N) | 223.04 |
| (O) | 2.40 |
| (P) | 12.00 |
| (Q) | 11.40 |
| (R) | 28794.00 |

The plates were imaged with an energy density of 57 μJ/cm$^2$. The imaging was carried out with an experimental violet platesetter device (flat bed system) equipped with a violet laser diode emitting between 392 to 417 nm. The following imaging conditions were used:
Scanning speed: 1000 m/s
Spot diameter: 20 μm
Addressability: 1270 dpi Each plate was divided in several parts and some of these parts are treated with and without a pre-heating step, performed for 20 sec. at 116° C., and processed at room temperature in different solutions as indicated in Table 13 (Gum-1 and Gum-2 for the invention examples, Water as comparative example). Table 13 summarizes the clean-out results of the non-exposed areas after processing with the different solutions. Rating 0 indicates no image formation, rating 1 indicates poor image formation with an insufficient clean-out, rating 2 indicates good image differentiation and a good clean-out, rating 3 indicates good image differentiation with excellent clean-out. Rating 3 and rating 2 correspond to a sufficient clean-out (invention examples), rating 0 and rating 1 correspond to a insufficient clean-out (comparative examples).

TABLE 13

Clean-out tests

| EXAMPLE | Pre-heat (20 s 116° C.) | Processing solution | Rating (0 to 3) | Comment |
|---|---|---|---|---|
| Example 12 | Yes | Gum-1 | 3 | Invention Example |
| | No | Gum-1 | 3 | Invention Example |
| | YES | Gum-2 | 3 | Invention Example |
| | NO | Gum-2 | 3 | Invention Example |
| Example 13 | Yes | Gum-1 | 3 | Invention Example |
| | No | Gum-1 | 3 | Invention Example |
| | YES | Gum-2 | 2 | Invention Example |
| | NO | Gum-2 | 2 | Invention Example |
| Example 14 | Yes | Gum-1 | 3 | Invention Example |
| | No | Gum-1 | 3 | Invention Example |
| | YES | Gum-2 | 2 | Invention Example |
| | NO | Gum-2 | 2 | Invention Example |
| Example 15 | Yes | Gum-1 | 2 | Invention Example |
| | No | Gum-1 | 3 | Invention Example |
| | YES | Gum-2 | 2 | Invention Example |
| | NO | Gum-2 | 2 | Invention Example |
| Example 16 | Yes | Gum-1 | 2 | Invention Example |
| | No | Gum-1 | 2 | Invention Example |
| | YES | Gum-2 | 2 | Invention Example |
| | NO | Gum-2 | 2 | Invention Example |
| Example 17 | Yes | Gum-1 | 2 | Invention Example |
| | No | Gum-1 | 2 | Invention Example |
| | YES | Gum-2 | 2 | Invention Example |
| | NO | Gum-2 | 2 | Invention Example |

A good clean-out is obtained for the plates processed with a gum-solution as demonstrated by the examples in Table 13.

Examples 18 to 21

Compositions were prepared (pw=parts per weight; wt. %=weight percentage) by mixing the components as specified in table 14. The solutions were coated onto electrochemically roughened and anodically oxidized aluminum sheets, the surface of which had been rendered hydrophilic by treatment with an aqueous solution of polyvinyl phosphonic acid (oxide weight 3 g/m²) and was dried for 1 minute at 120° C. (circulation oven).

TABLE 14

Composition of the photosensitive layer

| Composition (g) | Example 18 | Example 19 | Example 20 | Example 21 |
| --- | --- | --- | --- | --- |
| Alcotex 552P (1) | 3.75 | 3.75 | | |
| Mowiol 10-74 (2) | | | 33.75 | 33.75 |
| IR-Dye (3) | 0.0794 | 0.0794 | 0.0794 | 0.0794 |
| Triazine BU1549 (4) | 0.1984 | | 0.1984 | |
| TBMPS (5) | | 0.1984 | | 0.1984 |
| FST426R (6) | 1.859 | 1.859 | 1.859 | 1.859 |
| Edaplan LA411 (7) | 0.3375 | 0.3375 | 0.3375 | 0.3375 |
| Dowanol PM (8) | 36.87 | 36.87 | 4.375 | 4.375 |
| Dry thickness (g/m²) | 1.48 | 1.48 | 1.47 | 1.47 |

(1) Alcotex 552P is a 40% solution in water of polyvinylalcohol (hydrolysis degree =55%), obtained from Synthomer
(2) Mowiol 10-74 is 4% solution in Dowanol/water (76.8%/19.2%) of partially hydrolyzed polyvinylalcohol (degree of hydrolysis 74 %, viscosity 10 mPa · s in a solution of 4 wt. % at 20° C.) obtained from Clariant
(3) IR-Dye has the following structure:

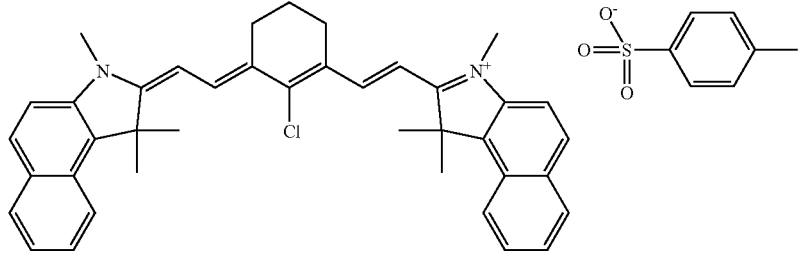

(4) Triazine BU1549 is 2-[1,1-biphenyl]-4-yl-4,6-bis(trichloromethyl)-1,3,5-triazine from Clariant
(5) TBMPS is tribromomethylphenyl sulphone
(6) FST42GR is a solution in 2-butanone containing 88.2 wt. % of a reaction product from 1 mole of 2,2,4-trimethyl-hexamethylenediisocyanate and 2 moles of hydroxy-ethylmethacrylate (viscosity 3.30 mm²/s at 25° C.)
(7) Edaplan LA411 is a surfactant (1% solution in Dowanol PM ® trade mark of Dow Chemical Company) obtained from Munzing Chemie
(8) Dowanol PM is propyleneglycol monomethylether obtained from Dow Chemical On top of the photosensitive layer a solution in water with the composition as defined in Table 15 was coated and was dried at 110° C. for 2 minutes. The so-formed protective overcoat had a dry thickness of 2.0 g/m².

TABLE 15

Composition of overcoat solution

| Component | Parts by Weight (g) |
| --- | --- |
| Overcoat type | 1 |
| partially hydrolyzed polyvinylalcohol (degree of hydrolysis 88%, viscosity 4 mPa · s in a solution of 4 wt. % at 20° C.). | 17.03 |
| partially hydrolyzed polyvinylalcohol (degree of hydrolysis 88%, viscosity 8 mPa · s in a solution of 4 wt. % at 20° C.). | 7.43 |
| Acacia gum (a polysaccharide available from Aldrich) | / |
| fully hydrolyzed polyvinylalcohol (degree of hydrolysis 98%, viscosity 6 mPa · s in a solution of 4 wt. % at 20° C.). | 14.87 |
| Acticide LA1206 (see Example 1) | 0.26 |
| Metolat FC 355 (see Example 1) | 0.38 |
| Lutensol A8 (90%) (see Example 1) | 0.032 |
| Water | 960 |

After drying of the overcoat layer, the plates were imaged with a Creo Trendsetter IR laser (830 nm) at different energies between 50 and 275 mJ/cm² and then passed through the pre-heat section of a VSP 85S processor (110° C.).

The pre-heat step was followed by a gumming step in an Azura C120 or Agfa HWP450 processor with Gum-2 or Gum-3 solutions as indicated in Table 16. All the plates show an excellent clean-out. The plates were than printed on a GTO-46 press with K+E 800 ink and Agfa Prima FS101 fountain and a compressible blanket. A run length of >1000 prints on offset paper were printed. The sensitivity was measured as the minimum energy at which a non-degraded, sharp printed image was visible at 1000 pages. In these experiments, the Dmax>1.5 and the Dmin=0.0. Results are shown in table 16.

Gum-3 is a solution prepared as follow:
To 700 g demineralised water
77.3 ml of Dowfax 3B2 (commercially available from Dow Chemical)
32.6 g of trisodium citrate dihydrate,
9.8 g citric acid were added under stirring and demineralised water was further added to 1000 g.
pH is between 4.8 and 5.2

TABLE 16

| EXAMPLE | Processing solution | results Sensitivity (mJ/m$^2$) |
|---|---|---|
| Example 18 | Gum-3 | 100 |
| Example 19 | Gum-2 | 200 |
| Example 19 bis | Gum-3 | 225 |
| Example 20 | Gum-3 | 100 |
| Example 21 | Gum-3 | 200 |

Example 22

Composition was prepared (pw=parts per weight; wt. %=weight percentage) by mixing the components as specified in table 17. The solution was coated onto electrochemically roughened and anodically oxidized aluminum sheets, the surface of which had been rendered hydrophilic by treatment with an aqueous solution of polyvinyl phosphonic acid (oxide weight 3 g/m$^2$) and was dried for 1 minute at 120° C. (circulation oven).

TABLE 17

| Composition of the photosensitive layer | |
|---|---|
| Composition (g) | Example 22 |
| Alcotex 552P (see Table 14) | 0.875 |
| 1,4-di[3,5-dimethoxy-4-(1-methylpropoxy)styryl]benzene | 0.0479 |
| 2,2'-bis(2-chlorophenyl)-4,4',5,5'-tetraphenyl-1,2-bisimidazole | 0.0794 |
| FST426R | 0.5375 |
| Edaplan LA411 (1% in DowanolPM) (see Table 14) | 0.1125 |
| 2-mercaptobenzthiazole | 0.0034 |
| 2-butanone | 4.00 |
| Dowanol PM (8) | 5.00 |
| Dry thickness (g/m$^2$) | 1.58 |

On top of the photosensitive layer a solution in water with the composition as defined in Table 15 was coated and was dried at 110° C. for 2 minutes. The so-formed protective overcoat had a dry thickness of 2.0 g/m$^2$.

Plates were imaged by a Polaris violet platesetter device (flat bed system) equipped with a violet laser diode emitting between 392 and 417 nm, and then passed through the pre-heat section of a VSP 85S processor (110° C.). The following imaging conditions were used:
Scanning speed: 600 or 1000 m/sec
Variable image plane power: 0 to 25 mW
Spot diameter: 20 μm
Addressability: 1270 dpi The pre-heat step was followed by a gumming step in a HWP450 processor with Gum-3 solution. The plate shows an excellent clean-out. The plate was than printed on a GTO-46 press with K+E 800 ink and Agfa Prima FS101 fountain and a compressible blanket. A run length of >250 prints on offset paper were printed. The sensitivity, measured as the minimum energy at which a non-degraded, sharp printed image was visible at 250 prints, was 68 μJ/cm$^2$. In this experiment, the Dmax>1.0 and the Dmin=0.0.

The invention claimed is:

1. A method of making a lithographic printing plate comprising the steps of:
   (a) providing a lithographic printing plate precursor comprising
      (i) a support having a hydrophilic surface or which is provided with a hydrophilic layer, and
      (ii) a coating comprising a photopolymerizable layer on said support,
   (b) image-wise exposing said coating in a plate setter, and
   (c) developing the precursor,
   wherein areas of the coating not image-wise exposed are removed from the support during the developing step,
   wherein the developing step comprises applying a gum solution comprising a surface protective compound onto the coating of the precursor, and
   wherein after the development step a layer of said surface protective compound remains on the lithographic printing plate.

2. The method according to claim 1, wherein the developing step is carried out off-press in a gumming unit which is mechanically coupled to the plate setter by conveying means, and wherein the precursor is shielded from ambient light while on the conveying means.

3. The method according to claim 1, wherein said gumming unit is provided with at least one roller for rubbing and/or brushing the coating during development.

4. The method according to claim 1, wherein said photopolymerizable layer comprises a polymerizable monomer or oligomer and an initiator capable of hardening said monomer or oligomer upon image-wise exposure of said coating.

5. The method according to claim 4, wherein said polymerizable monomer or oligomer is an ethylenically unsaturated compound having at least one terminal ethylenic group, and said initiator is a compound capable of generating a free radical.

6. The method according to claim 1, wherein said photopolymerizable layer further comprises a polymer having a mean molecular weight $M_w$ between 600 and 200,000 and an acid number between 10 and 250 or a hydroxyl number between 50 and 750.

7. The method according to claim 6, wherein said polymer has aliphatic or aromatic hydroxyl groups.

8. The method according to claim 7, wherein said polymer with aliphatic or aromatic hydroxyl groups is a copolymer containing units of hydroxyalkyl (meth)acrylates, allyl alcohol, hydroxystyrene or vinyl alcohol.

9. The method according to claim 6, wherein said polymer is a copolymer of vinylacetate and vinylalcohol.

10. The method according to claim 9, wherein said copolymer of vinylacetate and vinylalcohol comprises 10 to 98 mol % vinylalcohol.

11. The method according to claim 9, wherein said copolymer of vinylacetate and vinylalcohol has a viscosity, measured as a 4 weight % aqueous solution at 20° C., ranging between 3 and 60 mPa·s.

12. The method according to claim 1, wherein said photopolymerizable layer further comprises a polymer having vinylcaprolactam, vinylpyrrolidone or an alkylated vinylpyrrolidone as monomeric unit.

13. The method according to claim 1, wherein said imagewise exposing step includes the use of light and wherein said photopolymerizable layer further comprises a sensitizer capable of absorbing light used in said image-wise exposure step.

14. The method according to claim 13, wherein said sensitizer is capable of absorbing blue, green or red light.

15. The method according to claim 13, wherein said sensitizer is capable of absorbing violet light.

16. The method according to claim 13, wherein said sensitizer is capable of absorbing infrared light.

17. The method according to claim 1, wherein said photopolymerizable layer has a thickness ranging between 0.1 and 4 g/m$^2$.

18. The method according to claim 1, wherein said photopolymerizable layer further comprises a non-ionic surfactant.

19. The method according to claim 18, wherein said non-ionic surfactant is present in an amount ranging between 0.1 and 30 wt. % of the coating.

20. The method according to claim 1, wherein said coating further comprises a colorant.

21. The method according to claim 1, wherein said coating further comprises a top layer which acts as an oxygen barrier layer.

22. The method according to claim 21, wherein said top layer comprises a non-ionic surfactant.

23. The method according to claim 21, wherein said top layer has a layer thickness ranging between 0.10 and 2.0 g/m$^2$.

24. The method according to claim 1, wherein said gum solution has a pH between 3 and 9.

25. The method according to claim 1, wherein said gum solution has a pH between 4.5 and 8.5.

26. The method according to claim 1, wherein said gum solution comprises a film-forming hydrophilic polymer or surfactant.

27. The method according to claim 26, wherein said gum solution has a pH between 3 and 9.

28. The method according to claim 1, wherein said gum solution comprises an anionic surfactant.

29. The method according to claim 28, wherein said anionic surfactant is selected from the group consisting of aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyox-yethylenealkylethers, salts of phosphoric esters of polyoxyethylenealkylphenylethers, partially saponified compounds of styrenemaleic anhydride copolymers, partially saponified compounds of olefin-maleic anhydride copolymers, naphthalenesulfonateformalin condensates and mixtures thereof.

30. The method according to claim 29, wherein said anionic surfactant is selected from the group consisting of dialkylsulfosuccinates, salts of alkylsulfuric esters, alkylnaphthalenesulfonates and mixtures thereof.

31. The method according to claim 30, wherein said anionic surfactant is selected from the group consisting of sodium dodecylphenoxybenzene disulfonate, the sodium salt of alkylated naphthalenesulfonate, disodium methylene-di-naphtalene-disulfonate, sodium dodecyl-benzenesulfonate, sulfonated alkyl-diphenyloxide, ammonium or potassium perfluoroalkylsulfonate and sodium dioctyl-sulfosuccinate and mixtures thereof.

32. The method according to claim 1, wherein said gum solution comprises a non-ionic surfactant.

33. The method according to claim 32, wherein said non-ionic surfactant is selected from the group consisting of polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, olyethyleneglycolaliphatic esters, partial esters of poly-glycerinaliphatic acids, polyoxyethylenated castor oils, partial esters of polyoxyethyleneglycerin-aliphatic acids, aliphatic diethanolamides, N,N-bis-2-hydroxyal kylamines, polyoxyethylene alkylamines, triethanolaminealiphatic esters, trialkylamine oxides and mixtures thereof.

34. The method according to claim 33, wherein said non-ionic surfactant is selected from the group consisting of polyoxyethylene alkylphenyl ethers, poloxyethylene-polyoxypropylene block polymers and mixtures thereof.

35. The method according to claim 1, wherein said gum solution comprises an anionic surfactant and a non-ionic surfactant,
wherein said anionic surfactant is selected from the group consisting of aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyox-yethylenealkylethers, salts of phosphoric esters of polyoxyethylenealkylphenylethers, partially saponified compounds of styrenemaleic anhydride copolymers, partially saponified compounds of olefin-maleic anhydride copolymers, naphthalenesulfonateformalin condensates and mixtures thereof, and wherein said non-ionic surfactant is selected from the group consisting of polyoxyethylene alkyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycolaliph- atic esters, partial esters of poly-glycerinaliphatic acids, polyoxyethylenated castor oils, partial esters of polyoxyethyleneglycerinaliphatic acids, aliphatic diethanolamides, N,N-bis-2-hydroxyalkylamines, polyoxyethylene alkylamines, triethanolaminealiphatic esters, trialkylamine oxides and mixtures thereof.

36. The method according to claim 35, wherein said anionic surfactant is selected from the group consisting of sodium dodecylphenoxybenzene disulfonate, the sodium salt of alkylated naphthalenesulfonate, disodium methylene-dinaphtalene-disulfonate, sodium dodecyl-benzenesulfonate, sulfonated alkyl-diphenyloxide, ammonium or potassium perfluoroalkylsulfonate and sodium dioctyl-sulfosuccinate and mixtures thereof, and wherein said non-ionic surfactant is selected from the group consisting of polyoxyethylene alkylphenyl ethers, poloxyethylene-polyoxypropylene block polymers and mixtures thereof.

37. The method according to claim 1, wherein the gum solution comprises a component selected from the group consisting of gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride, a copolymer of styrene and maleic anhydride and mixtures thereof.

38. The method according to claim 37, wherein the gum solution comprises a component selected from the group consisting of (meth)acrylic acid, vinyl acetate, styrene sulfonic acid, vinyl sulfonic acid, vinyl phosphonic acid, acrylamidopropane sulfonic acid and mixtures thereof.

39. The method according to claim 28, wherein the coating further comprises a colorant.

40. The method according to claim 39, wherein the lithographic printing plate is a negative-working precursor.

41. The method according to claim 1, wherein said photopolymerizable layer comprises a polymerizable monomer or oligomer and an initiator capable of hardening said monomer or oligomer upon image-wise exposure of said coating, wherein said polymerizable monomer or oligomer is an ethylenically unsaturated compound having at least one terminal ethylenic group, and said initiator is a compound capable of generating a free radical, and wherein said photopolymerizable layer further comprises a polymer having a mean molecular weight $M_w$ between 600 and 200,000 and an acid number between 10 and 250 or a hydroxyl number between 50 and 750.

42. The method according to claim 41, wherein said gum solution has a pH between 4.5 and 8.5.

43. The method according to claim 42, wherein said anionic surfactant is selected from the group consisting of dialkylsulfosuccinates, salts of alkylsulfuric esters, alkylnaphthalenesulfonates and mixtures thereof.

44. The method according to claim 43, wherein the gum solution has a viscosity ranging from 1.7 to 5 mPa·s.

45. The method according to claim 43, wherein the gum solution further comprises an inorganic salt.

46. The method according to claim 43, wherein the gum solution is a baking gum solution.

47. The method according to claim 15, wherein the image-wise exposed precursor is heated prior to the developing step.

48. The method according to claim 1, wherein the image-wise exposure is laser exposure or digital modulated UV-exposure.

49. The method according to claim 48, wherein the image-wise exposure is laser exposure.

50. The method according to claim 48, wherein the image-wise exposure is digital modulated UV-exposure.

51. The method according to claim 42, wherein the plate setter is mechanically coupled to the gumming unit by conveying means, and wherein the precursor is shielded from ambient light while on the conveying means.

52. The method according to claim 51, wherein the image-wise exposure is laser exposure or digital modulated UV-exposure.

53. The method according to claim 1, wherein the image-wise exposed precursor is heated prior to the developing step.

54. The method according to claim 28, wherein the image-wise exposed precursor is heated prior to the developing step.

55. The method according to claim 45, wherein the image-wise exposed precursor is heated prior to the developing step.

56. A method of making a lithographic printing plate comprising the steps of:
  (a) providing a lithographic printing plate precursor comprising
    (i) a support having a hydrophilic surface or which is provided with a hydrophilic layer, and
    (ii) a coating comprising a photopolymerizable layer on said support,
  (b) image-wise exposing said coating in a plate setter, and
  (c) applying a gum solution having a pH of between 3 and 9 and comprising a surfactant or a film-forming hydrophilic polymer onto the imagewise exposed coating provided by step (b),
  wherein areas of the coating not image-wise exposed are removed from the support during step (c), and
  wherein a layer formed on the image-wise exposed plate after the application of the gum solution in step (c) remains on the lithographic printing plate.

57. The method according to claim 56, wherein the plate setter is mechanically coupled to the gumming unit by conveying means, and wherein the precursor is shielded from ambient light while on the conveying means.

58. The method according to claim 57, wherein said gumming unit is provided with at least one roller for rubbing and/or brushing the coating during development.

59. A method of making a lithographic printing plate comprising the steps of:
  a) providing a lithographic printing plate precursor comprising
    (i) a support having a hydrophilic surface or which is provided with a hydrophilic layer, and
    (ii) a coating comprising a photopolymerizable layer on said support,
  b) image-wise exposing said coating in a plate setter, and
  c) developing the precursor thereby removing non-exposed areas of the coating from the support, wherein the developing step is carried out by treating the coating of the precursor with a gum solution which comprises a surface protective compound, thereby developing and gumming the plate in a single step.

60. The method according to claim 59, wherein there is no subsequent rinsing of the printing plate precursor after the developing step.

61. The method according to claim 59, wherein there is no subsequent gumming of the printing plate precursor after the developing step.

62. The method according to claim 59, wherein the coating further includes an oxygen barrier top layer.

* * * * *